(12) United States Patent  
Kagami

(10) Patent No.: US 10,871,516 B2  
(45) Date of Patent: Dec. 22, 2020

(54) INSPECTION SYSTEM

(71) Applicant: TOKYO ELECTRON LIMITED, Tokyo (JP)

(72) Inventor: Tetsuya Kagami, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/490,484

(22) PCT Filed: Feb. 1, 2018

(86) PCT No.: PCT/JP2018/003382  
§ 371 (c)(1),  
(2) Date: Aug. 30, 2019

(87) PCT Pub. No.: WO2018/159207  
PCT Pub. Date: Sep. 7, 2018

(65) Prior Publication Data  
US 2020/0011925 A1    Jan. 9, 2020

(30) Foreign Application Priority Data  
Mar. 3, 2017  (JP) .................................. 2017-040383

(51) Int. Cl.  
*G01R 1/04* (2006.01)  
*G01R 1/067* (2006.01)  
(Continued)

(52) U.S. Cl.  
CPC ..... *G01R 31/2831* (2013.01); *G01R 1/07307* (2013.01); *G01R 31/2886* (2013.01); *G01R 31/2893* (2013.01); *H01L 21/683* (2013.01)

(58) Field of Classification Search  
CPC .......... G01R 1/04; G01R 1/067; G01R 1/073; G01R 1/07314; G01R 1/07342;  
(Continued)

(56) References Cited  
U.S. PATENT DOCUMENTS 5,172,053 A * 12/1992 Itoyama ............. G01R 1/07314  
324/72.5  
5,539,676 A *  7/1996 Yamaguchi ........ G01R 1/07314  
324/750.16  
(Continued)

FOREIGN PATENT DOCUMENTS

CN         102301462 A    12/2011  
DE         19926701 A1    12/1999  
(Continued)

OTHER PUBLICATIONS

PCT International Search Report and Written Opinion, PCT Application No. PCT/JP2018/003382, dated Apr. 24, 2018, 8 pages (with English translation of International Search Report).

*Primary Examiner* — Neel D Shah  
(74) *Attorney, Agent, or Firm* — Fenwick & West LLP

(57) ABSTRACT

An inspection system includes a plurality of prober units each configured to bring probes of a probe card into contact with devices formed on a substrate on a stage, and a tester configured to apply electrical signals to the devices on the substrate through the probe card to inspect electrical characteristics of the devices. The plurality of prober units are arranged such that a plurality of units each of which has the prober units stacked in multiple stages are arranged in multiple rows in a horizontal direction, and at least one test unit constituting a main part of the tester is arranged to a side of a predetermined prober unit among the plurality of prober units.

13 Claims, 5 Drawing Sheets

(51) Int. Cl.
*G01R 1/073* (2006.01)
*G01R 31/27* (2006.01)
*G01R 31/28* (2006.01)
*H01L 21/683* (2006.01)

(58) Field of Classification Search
CPC ...... G01R 1/07378; G01R 1/20; G01R 31/27; G01R 31/28
See application file for complete search history.

(56) References Cited

U.S. PATENT DOCUMENTS

| | | | |
|---|---|---|---|
| 5,754,057 A * | 5/1998 | Hama | G01R 31/2887 324/754.03 |
| 9,121,901 B2 | 9/2015 | Kiyokawa et al. | |
| 2001/0026166 A1 | 10/2001 | Khoury et al. | |
| 2011/0316571 A1* | 12/2011 | Kiyokawa | G01R 31/2893 324/750.16 |
| 2014/0145742 A1* | 5/2014 | Sugai | G01R 31/2889 324/756.03 |
| 2014/0203837 A1* | 7/2014 | Minemier | G01R 31/2851 324/762.03 |

FOREIGN PATENT DOCUMENTS

| | | |
|---|---|---|
| JP | 2000-74941 A | 3/2000 |
| JP | 2014-179379 A | 9/2014 |
| KR | 10-2000-0006268 A | 1/2000 |
| KR | 10-2011-0119771 A | 11/2011 |
| SG | 108210 A | 1/2005 |
| TW | 440696 B | 6/2001 |
| TW | 201104773 A | 2/2011 |
| WO | WO 2010/092672 A1 | 8/2010 |

* cited by examiner

INSPECTION SYSTEM

TECHNICAL FIELD

The present invention relates to an inspection system for inspecting a substrate.

BACKGROUND

In a semiconductor device manufacturing process, an electrical inspection of a plurality of semiconductor elements (devices) formed on a semiconductor wafer is performed after all processes are performed on the semiconductor wafer (hereinafter, simply referred to as "wafer") as a substrate. An apparatus for performing such an electrical inspection generally includes a wafer stage, a probe card having probes to be in contact with the devices, a prober unit having an aligner for aligning the wafer or the like, and a tester for testing various electrical characteristics of the devices by applying electrical signals to the devices.

In order to efficiently perform the electrical inspection on a plurality of wafers, there is suggested an inspection system in which cells, each of which includes a prober unit having a probe card, a wafer chuck plate and the like, and a test head accommodating therein a tester, are arranged in multiple rows in a horizontal direction and in multiple stages in a height direction (see, e.g., Patent document 1). Patent document 1 discloses an example in which the cells are arranged in four rows in the horizontal direction and in three stages in the height direction. In each cell, a test head is mounted on the prober unit.

PRIOR ART

Patent document 1: Japanese Patent Application Publication No. 2014-179379

In the above-described inspection system, it is required to increase the number of cells in order to perform a more efficient inspection and to increase the throughput. Since, however, a clean room where the inspection system is disposed has a height limit, it is difficult to increase the number of cells in the height direction. Further, there is a limitation in increasing the number of cells in the horizontal direction because it is necessary to minimize the footprint of the system in the clean room.

Therefore, the present invention provides an inspection system capable of efficiently inspecting a substrate while ensuring a higher throughput compared to that in a conventional case and minimizing the increase in the footprint.

SUMMARY

In accordance with an embodiment of the present invention, there is provided an inspection system including: a plurality of prober units, each configured to bring probes of a probe card into contact with devices formed on a substrate on a stage; and a tester configured to apply electrical signals to the devices on the substrate through the probe card to inspect electrical characteristics of the devices. Further, multiple units, each of which includes the prober units stacked in multiple stages, are arranged in multiple rows in a horizontal direction, and at least one test unit constituting a main part of the tester is disposed at a side of a predetermined prober unit among the prober units.

Further, the test unit may be disposed between adjacent prober units in the horizontal direction among the prober units.

Further, the tester may include one or more tester module boards, each of which is configured to apply electrical signals to the devices formed on the substrate to measure electrical characteristics of the devices, and one or more tester motherboards, each of which serves as an interface between the probe card and one of the tester module boards connected thereto. The test unit may include the tester module boards, and a controller and a power supply for the tester module boards. The tester motherboards may be disposed at the prober units corresponding thereto.

Further, the test unit may be provided to correspond to the prober units, and may include the tester module boards connected to the tester motherboards of the prober units corresponding thereto.

Further, the at least one test unit includes two or more test units depending on the number of the prober units, and each of the two or more test units may be connected to two of the prober units disposed at both sides thereof or four of the prober units, two at each of both sides thereof.

Further, each of the tester module boards and each of the tester motherboards may be connected by a cable or a connector.

Further, a contact block may be disposed between the probe card and one of the tester motherboards corresponding to the probe card, and the probe card and the contact block may be connected by pogo pins. Further, the contact block and one of the tester motherboards corresponding to the probe card may be connected by soldering or a connector.

Further, among components of each of the tester module boards, a component having a high operating frequency or a component having a high waveform accuracy may be disposed closer to one of the tester motherboards connected thereto. In this case, the components of each of the tester module boards may be arranged closer to one of the tester motherboards connected thereto in the order of the component having a higher operating frequency to a lower operating frequency or a higher waveform accuracy to a lower waveform accuracy.

Effect

In accordance with the embodiment of the present invention, the units, each of which includes the prober units stacked in multiple stages in the height direction, are arranged in multiple rows in the horizontal direction, and the test unit constituting the main part of the tester is disposed at a side of a predetermined prober unit among the prober units. Therefore, the inspection on the substrate can be efficiently performed while ensuring a higher throughput compared to that in the conventional case and minimizing the increase in the footprint.

DETAILED DESCRIPTION

Hereinafter, embodiments of the present invention will be described in detail with reference to the accompanying drawings.

First Embodiment

First, a first embodiment will be described.

Figure 1:
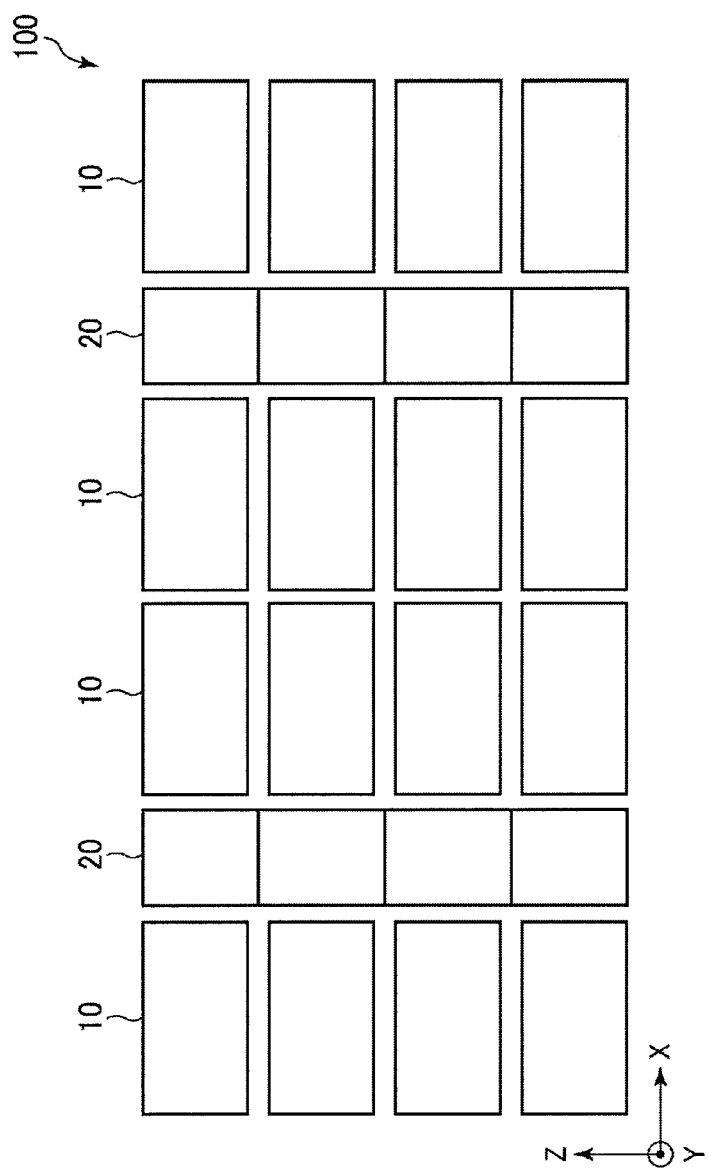
FIG. 1 is a side view schematically showing a configuration of an inspection system according to a first embodiment of the present invention.
Figure 2:
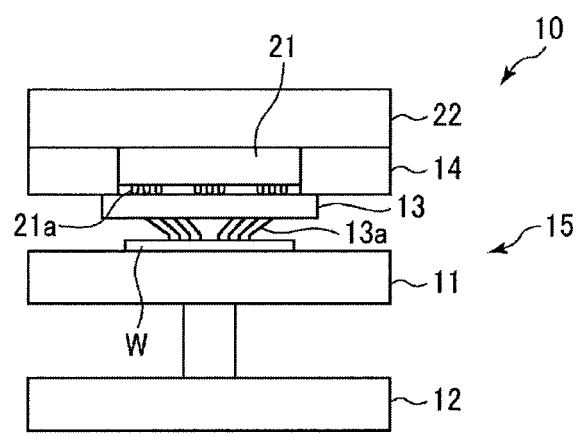
FIG. 2 schematically shows a configuration of a prober unit in the inspection system shown in FIG. 1.
Figure 3:
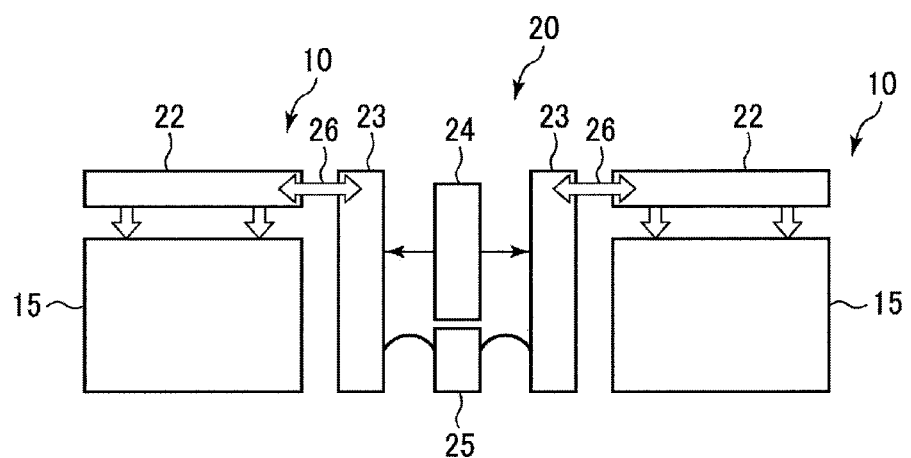
FIG. 3 shows a configuration of a test unit and a connection between the test unit and a tester motherboard disposed at the prober unit in the inspection system shown in FIG. 1.

FIG. 1 is a side view schematically showing a configuration of an inspection system according to a first embodiment of the present invention. FIG. 2 schematically shows a configuration of a prober unit in the inspection system shown in FIG. 1. FIG. 3 shows a configuration of a test unit and a connection between the test unit and a tester motherboard disposed at the prober unit in the inspection system shown in FIG. 1.

An inspection system 100 of the present embodiment performs electrical inspection of a wafer W serving as a target substrate. As shown in FIG. 1, units, each of which includes the prober units 10 stacked in four stages in a height direction (Z-direction), are arranged in four rows in a horizontal direction (X-direction). The inspection system 100 includes sixteen prober units 10 in total.

A test unit 20 constituting a main part of a tester is disposed at a side of a predetermined prober unit 10 among the prober units 10. Specifically, the test unit 20 is disposed between the prober units 10 adjacent to each other in the horizontal direction. There are eight test units 20 in total.

As shown in FIG. 2, the prober unit 10 includes a stage 11 configured to attract and hold the wafer W by vacuum attraction or the like; an aligner 12 configured to move the stage 11 in the X, Y, Z, and θ directions using an X-Y table mechanism, a Z-direction moving mechanism, and a θ-direction moving mechanism (all not shown) to position the wafer W at a predetermined position; a probe card 13 disposed opposite to the stage 11; a prober main body 15 having a support plate 14 for supporting the probe card 13; and a contact block 21 that connects the probe card 13 and a tester motherboard 22 that is a component of the tester. The tester motherboard 22 is disposed on the contact block 21. In other words, the tester motherboard 22 is disposed at the prober unit 10.

The probe card 13 has a plurality of probes 13a to be in contact with electrodes of devices formed on the wafer W. A plurality of pogo pins 21a is disposed at a bottom of the contact block 21 and is connected to the probe card 13. The tester motherboard 22 and the contact block 21 are connected by a direct soldering or through a connector. For example, there are provided about 10000 pogo pins 21a.

When the inspection is performed in a state where the probes 13a are in contact with the electrodes of the devices formed on the wafer W, an inspection space between the support plate 14 and the stage 11 may be sealed with a sealing member or a bellows and depressurized to allow the stage 11 to be bonded with the support plate 14. In that case, one aligner 12 may be shared by four prober units 10 on the same stage.

The test unit 20 constitutes a main part of the tester and can be connected to two prober units 10 disposed at both sides thereof. As shown in FIG. 3, the test unit 20 includes two tester module boards 23, one controller 24, and one power supply 25. The tester includes the test unit 20 and the tester motherboard 22 disposed at the prober unit 10. Each of the tester module boards 23 is disposed near the prober unit 10 corresponding thereto. The tester module boards 23 are controlled by the common controller 24 and supplied with power from the common power supply 25. As an example of the controller 24, it is possible to use, e.g., a personal computer. The power supply 25 supplies power to the tester module boards 23 and the controller 24.

The tester module boards 23 are provided for a power supply to the devices on the wafer W, a waveform input (driver), a waveform measurement (comparator), a voltage output, a current output, a voltage measurement, and a current measurement. Each of the tester module boards 23 includes a plurality of boards. Among the components of the tester, the tester motherboard 22 disposed at the prober unit 10 is configured to transmit and receive an input/output of a waveform, a voltage, and a current between the tester module board 23 connected thereto and the probe card 13. Further, capacitors for the devices are mounted on the tester. The tester module board 23 and the tester motherboard 22 corresponding thereto are connected by the wire 26 of which impedance can be adjusted. Further, the tester module board 23 and the tester motherboard 22 may be connected through a connector.

Although it is not shown, the inspection system 100 includes four transfer units configured to transfer the wafers W to four prober units 10 on each stage, and a loading/unloading unit connected to a wafer storage container, a probe card storage container, or the like. The transfer units are also configured to transfer the probe card at the time of replacement of the probe card. Although it is also not shown, the inspection system 100 includes a control unit for controlling the transfer of the wafer W to the prober unit 10, the movement of the stage 11, a vacuum system, or the like.

In the inspection system 100 configured as described above, the wafer W is transferred to each prober unit 10 by the transfer unit, and the position of the stage 11 is adjusted to bring the probes 13a of the probe card 13 into contact with electrodes of devices formed on the wafer W. Then, the electrical characteristics of the wafer W are inspected by the tester. At this time, the wafers W are sequentially transferred to the sixteen prober units 10 and can be inspected simultaneously by the tester.

Figure 4:
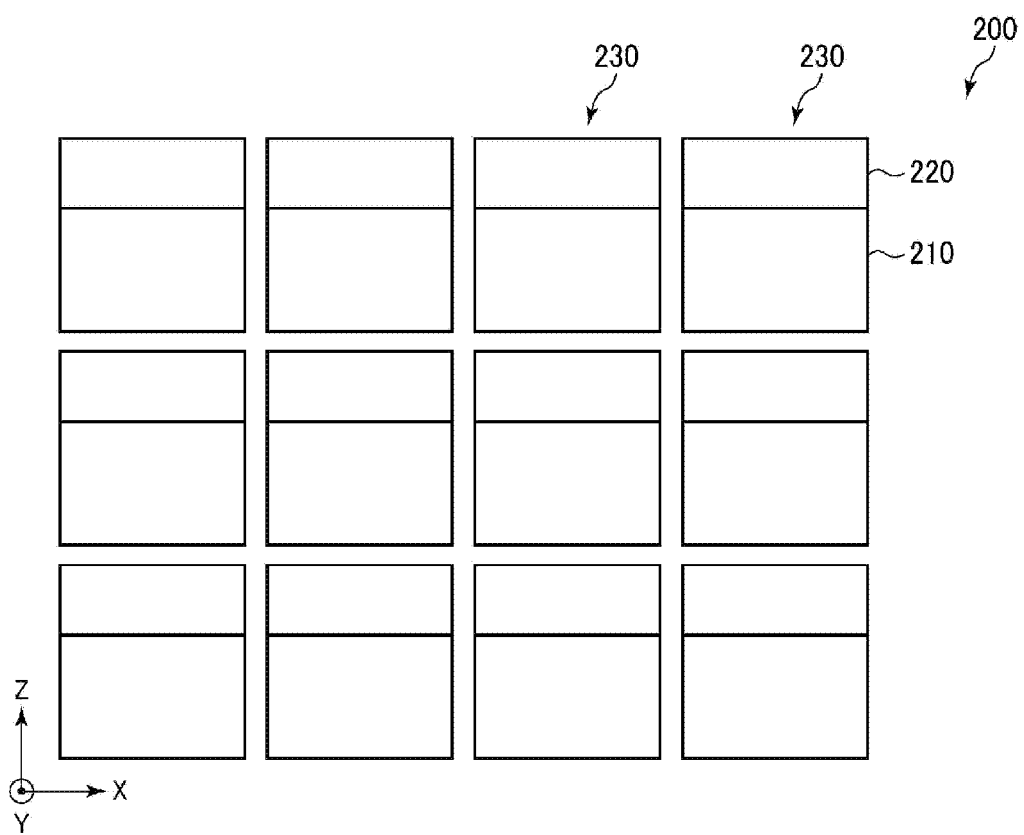
FIG. 4 is a side view schematically showing a conventional inspection system.

As shown in FIG. 4, a conventional inspection system 200 has a configuration in which multiple cells 230 are arranged in a horizontal direction and in a height direction. Each of the cells 230 has a structure in which a test head 220 that includes a housing and the components of the tester accommodated in the housing is mounted on the prober unit 210. However, a height of each cell 230 having the conventional structure in which the test head 220 is mounted on the prober unit 210 becomes high. Further, the number of cells stacked in the height direction is often limited to three as shown in FIG. 4, although it depends on the type of the inspection system 200. Therefore, in order to increase the throughput by increasing the number of cells, the number of cells in the horizontal direction is increased. In that case, however, the footprint of the system increases. Further, in the conventional inspection system, a frame is divided for each cell, and the test head 220 is accommodated in the frame. Thus, the test head 220 is restricted by the prober unit. Accordingly, even if the size of the test head 220 is reduced, the volume is not changed and, thus, it is difficult to improve the overall volumetric efficiency. As a result, it is difficult to increase the number of cells while suppressing the increase in the footprint.

Therefore, in the present embodiment, instead of the conventional cell structure in which the prober unit and the test head are integrated, the main components of the tester are unitized to form the test unit 20, and the prober unit 10 and the test unit 20 are separately provided. Further, the test unit 20 is disposed at the side of the prober unit 10.

Accordingly, only the prober units 10 are stacked in the height direction and, thus, the number of stages in the height direction can be increased. For example, the number of stages can be increased from three in the conventional case shown in FIG. 4 to four shown in FIG. 1. Further, since the test unit 20 is disposed at the side of the prober unit 10, the footprint may be increased. However, the prober unit 10 and the test unit 20 are completely separated, so that it is not necessary to provide the test head in the frame of the prober unit unlike the conventional case. Hence, the configuration of the test unit 20 can be determined without the restriction caused by ensuring a certain space for the test head in the frame of the cell as in the conventional case. Accordingly, the volumetric efficiency can be enhanced and the increase in the footprint can be minimized. Particularly, since the test unit 20 is disposed between two prober units 10 and is connected to the two prober units 10 disposed at both sides thereof, the controller 24 and the power supply 25 can be shared by the two prober units 10, and the size of the test unit 20 can be reduced. As a result, the increase in the footprint can be further suppressed. Since the width of the test unit 20 can be properly adjusted depending on the performance (operating frequency, the number of power supplies, or the like), the footprint can be finely adjusted.

As described above, the number of stages of the prober units 10 can be increased, the degree of freedom in the configuration and the arrangement of the test units 20 can be increased, and one test unit 20 can be shared by two prober units 10. Therefore, the number of prober units for wafer processing can be increased without increasing the footprint. Consequently, the substrate can be inspected efficiently while ensuring a higher throughput compared to that in the conventional case and minimizing the increase in the footprint.

Further, the tester motherboard 22 has high contact stability because a load from the test head is not applied thereto, unlike the conventional case. Since no load is applied to the tester motherboard 22, the tester motherboard and the contact block 21 can be connected by direct soldering or through a connector, which further improves the contact stability.

Since the tester module board 23 and the tester motherboard 22 are connected through the wire or the connector, the problem of the pin assignment varying for each manufacturer in the conventional case can be solved by cable replacement, which results in cost reduction. Further, by connecting the tester module board 23 and the tester motherboard 22 through the wire or the connector, the heat transfer between the prober unit 10 and the test unit 20 can be easily prevented. Therefore, the heat efficiency is improved not only in a room-temperature inspection but also in the inspection sensitive to the heat transfer of the prober units such as a low-temperature inspection or a high-temperature inspection.

As described above, since the test unit 20 is in a dedicated area separate from the prober unit 10, a housing such as a conventional test head is not required. Further, since the test unit 20 is connected to the prober units 10 disposed at both sides thereof and the controller 24 and the power supply 25 are shared, cost reduction can be realized.

Further, since the prober unit 10 may have the same structure as that of the conventional one, it is possible to use many of the components of the conventional inspection system, so that the increase in the apparatus cost can be suppressed.

Second Embodiment

Next, a second embodiment will be described.

Figure 5:
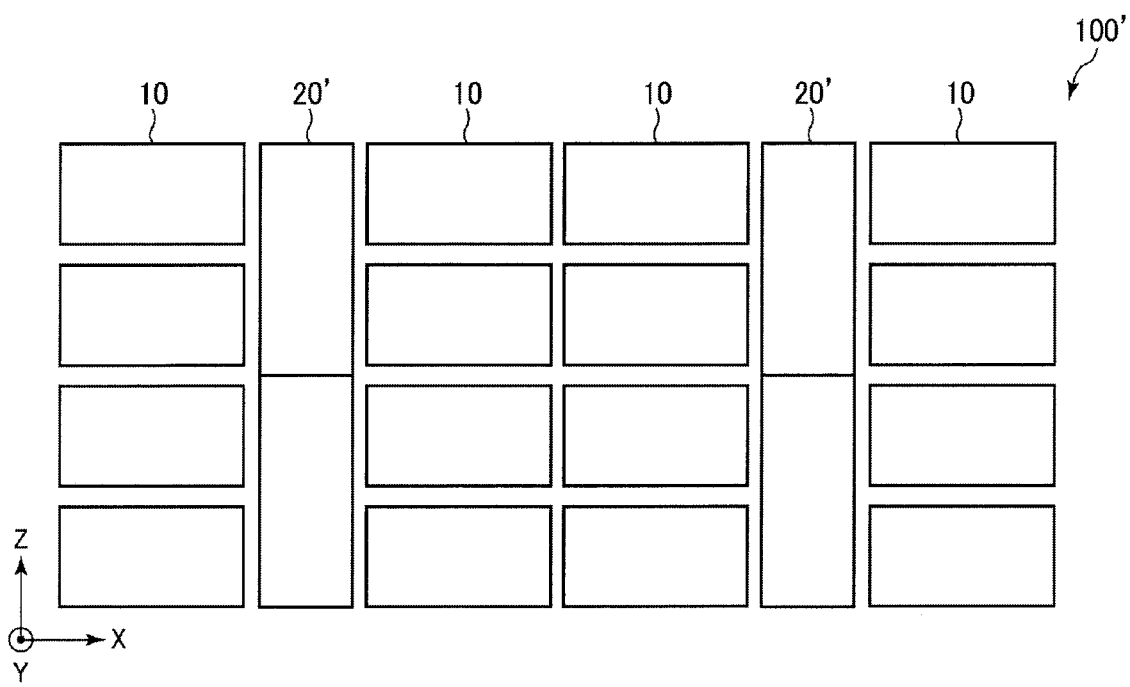
FIG. 5 is a side view schematically showing a configuration of an inspection system according to a second embodiment of the present invention.
Figure 6:
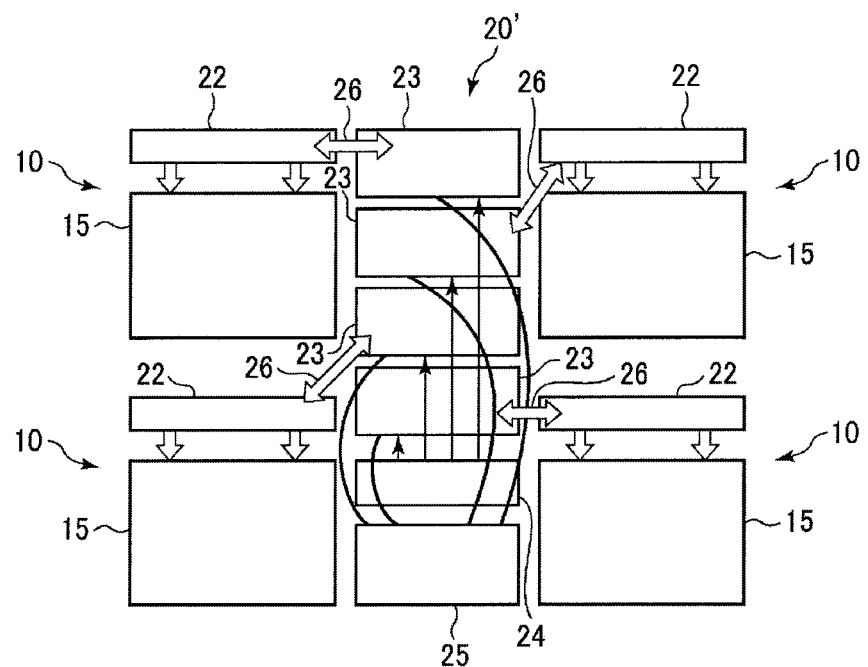
FIG. 6 shows a configuration of a test unit and a connection between the test unit and a tester motherboard disposed at a prober unit in the inspection system shown in FIG. 5.

FIG. 5 is a side view schematically showing a configuration of an inspection system according to a second embodiment of the present invention. FIG. 6 shows a configuration of a test unit and a connection between the test unit and a tester motherboard disposed at a prober unit in the inspection system shown in FIG. 5.

As in the first embodiment, units, each of which includes the prober units 10 stacked in four stages in the height direction (Z-direction), are arranged in four rows in the horizontal direction (X-direction). An inspection system 100' of the present embodiment includes sixteen prober units 10 in total.

A test unit 20' constituting a main part of the tester is disposed between the prober units 10 adjacent to each other in the horizontal direction. One test unit 20' is connected to four prober units 10 arranged in two stages at both sides thereof.

Specifically, the test unit 20' includes four tester module boards 23 corresponding to the prober units 10, respectively, one controller 24, and one power supply 25. The test unit 20' has a structure in which the power supply 25, the controller 24, and four tester module boards 23 are arranged in that order from the bottom. Each of the tester module boards 23 is connected by the wire 26 to the tester motherboard 22 of the prober unit 10 closest thereto. The connection may be made using a connector.

In the present embodiment, one test unit 20' is disposed for four prober units 10, and the controller 24 and the power supply 25 can be shared by four tester module boards 23. Therefore, the volumetric efficiency of the test unit 20' is higher than that of the test unit 20 of the first embodiment. Accordingly, the footprint of the system can be reduced compared to that in the first embodiment. In addition, since the controller 24 and the power supply 25 can be shared by the four tester module boards 23, the cost reduction effect is higher than that in the first embodiment.

Third Embodiment

Next, a third embodiment will be described.

Figure 7:
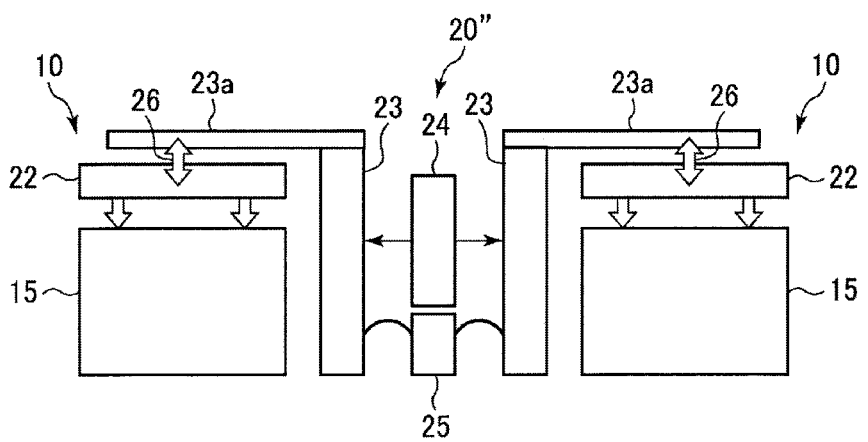
FIG. 7 shows a configuration of a test unit and a connection between the test unit and a tester motherboard disposed at a prober unit in an inspection system according to a third embodiment of the present invention.

FIG. 7 shows a configuration of a test unit and a connection between the test unit and a tester motherboard of a prober unit in an inspection system according to the third embodiment of the present invention.

In the present embodiment, as in the first embodiment, units, each of which includes the prober units 10 stacked in four stages in the height direction (Z-direction), are arranged in four rows in the horizontal direction (X-direction). The inspection system includes sixteen prober units 10 in total. A test unit 20" constituting a main part of the tester is disposed between the prober units 10 adjacent to each other in the horizontal direction.

Similar to the test unit 20 of the first embodiment, the test unit 20" includes two tester module boards 23, one controller 24, and one power supply 25. However, the test unit 20" is different from the test unit 20 in that a component 23a having a high operating frequency or a high waveform accuracy among components of the tester module board 23 is disposed closer to the tester motherboard 22 corresponding to the tester module board 23.

By arranging the component 23a having the high operating frequency or the high waveform accuracy closer to the tester motherboard 22, it is possible to transmit a high frequency waveform and a high-accuracy waveform without deterioration.

Here, it is preferable to arrange the components of the tester module board 23 closer to the tester motherboard 22 corresponding to the tester module board 23 in the order of the component having the higher operating frequency to the lower operating frequency or the higher waveform accuracy to the lower waveform accuracy.

Other Applications

The present invention is not limited to the above-described embodiments, and various modifications can be made within the scope of the present invention. For example, in the above-described embodiments, the prober units are arranged in four rows in the horizontal direction and in four stages in the height direction. However, the number of rows and the number of stages are not limited thereto. In addition, although the case where the test unit is connected to two prober units disposed at both sides thereof or connected to four prober units, two at each of both sides thereof has been described, the present invention is not limited thereto. For example, the test unit may be connected to eight prober units, four at each of both sides thereof. Alternatively, the prober unit and the test unit may be disposed in a one-to-one corresponding relationship.

DESCRIPTION OF REFERENCE NUMERALS

10: prober unit
11: stage
12: aligner
13: probe card
13a: probes
14: support plate
20, 20', 20": test unit
21: contact block
21a: pogo pin
22: tester motherboard
23: tester module board
23a: component
24: controller
25: power supply
26: wire
100, 100': inspection system
W: semiconductor wafer (substrate)

The invention claimed is:

1. An inspection system comprising:
a plurality of prober units, each configured to bring probes of a probe card into contact with devices formed on a substrate on a stage; and
a tester configured to apply electrical signals to the devices on the substrate through the probe card to inspect electrical characteristics of the devices,
wherein multiple units, each of which includes the prober units stacked in multiple stages, are arranged in multiple rows in a horizontal direction, and
at least one test unit constituting a main part of the tester is disposed at a side of a predetermined prober unit among the prober units,
wherein the test unit is disposed between adjacent prober units in the horizontal direction among the prober units.

2. The inspection system of claim 1, wherein the tester includes one or more tester module boards, each of which is configured to apply electrical signals to the devices formed on the substrate to measure electrical characteristics of the devices, and one or more tester motherboards, each of which serves as an interface between the probe card and one of the tester module boards connected thereto,
the test unit includes the tester module boards, and a controller and a power supply for the tester module boards, and
the tester motherboards are disposed at the prober units corresponding thereto.

3. The inspection system of claim 2, wherein the test unit is provided to correspond to the prober units, and includes the tester module boards connected to the tester motherboards of the prober units corresponding thereto.

4. The inspection system of claim 3, wherein the at least one test unit includes two or more test units depending on the number of the prober units.

5. The inspection system of claim 4, wherein each of the two or more test units is connected to two of the prober units disposed at both sides thereof.

6. The inspection system of claim 4, wherein each of the two or more test units is connected to four of the prober units, two at each of both sides thereof.

7. The inspection system of claim 2, wherein each of the tester module boards and each of the tester motherboards are connected by a cable or a connector.

8. The inspection system of claim 2, wherein a contact block is disposed between the probe card and one of the tester motherboards corresponding to the probe card, and the probe card and the contact block are connected by pogo pins.

9. The inspection system of claim 8, wherein the contact block and one of the tester motherboards corresponding to the probe card are connected by soldering or a connector.

10. The inspection system of claim 2, wherein among components of each of the tester module boards, a component having a high operating frequency or a component having a high waveform accuracy is disposed closer to one of the tester motherboards connected thereto.

11. An inspection system comprising:
a plurality of prober units, each configured to bring probes of a probe card into contact with devices formed on a substrate on a stage; and
a tester configured to apply electrical signals to the devices on the substrate through the probe card to inspect electrical characteristics of the devices,
wherein multiple units, each of which includes the prober units stacked in multiple stages, are arranged in multiple rows in a horizontal direction, and
at least one test unit constituting a main part of the tester is disposed at a side of a predetermined prober unit among the prober units,
the tester includes one or more tester module boards, each of which is configured to apply electrical signals to the devices formed on the substrate to measure electrical characteristics of the devices, and one or more tester motherboards, each of which serves as an interface between the probe card and one of the tester module boards connected thereto,
the test unit includes the tester module boards, and a controller and a power supply for the tester module boards,
the tester motherboards are disposed at the prober units corresponding thereto, among components of each of the tester module boards, a component having a high operating frequency or a component having a high waveform accuracy is disposed closer to one of the tester motherboards connected thereto, and the components of each of the tester module boards are arranged closer to one of the tester motherboards connected thereto in the order of the component having a higher operating frequency to a lower operating frequency or a higher waveform accuracy to a lower waveform accuracy.

12. The inspection system of claim 11, wherein each of the tester module boards and each of the tester motherboards are connected by a cable or a connector.

13. The inspection system of claim 11, wherein a contact block is disposed between the probe card and one of the tester motherboards corresponding to the probe card, and the probe card and the contact block are connected by pogo pins.

* * * * *